United States Patent [19]

Thakur et al.

[11] Patent Number: 5,658,381
[45] Date of Patent: Aug. 19, 1997

[54] METHOD TO FORM HEMISPHERICAL GRAIN (HSG) SILICON BY IMPLANT SEEDING FOLLOWED BY VACUUM ANNEAL

[75] Inventors: Randhir P. S. Thakur, Boise; Michael Nuttall, Meridian, both of Id.

[73] Assignee: Micron Technology, Inc., Boise, Id.

[21] Appl. No.: 439,022

[22] Filed: May 11, 1995

[51] Int. Cl.$^6$ .................................................. C30B 31/22
[52] U.S. Cl. .............................. 257/309; 117/7; 257/317; 438/398; 438/665; 438/964
[58] Field of Search .................. 117/2, 7, 8, 88; 437/52, 60, 193, 919

[56] References Cited

U.S. PATENT DOCUMENTS 5,162,248  11/1992  Dennison et al. ..................... 437/52
5,340,765  8/1994  Dennison et al. ..................... 437/52

FOREIGN PATENT DOCUMENTS 2258690A  3/1989  Japan .
2258690   10/1990 Japan .......................................... 117/7

*Primary Examiner*—Felisa Garrett

[57] ABSTRACT

Hemispherical grain (HSG) silicon for a semiconductor device, is formed by: introducing a crystallization nucleus into a silicon material; and converting the silicon material into the HSG silicon by promoting the growth of the crystallization nucleus during a high vacuum anneal. An embodiment of the present invention is a semiconductor device having hemispherical grain (HSG) silicon, where the HSG silicon comprises a silicon material converted into the HSG silicon from the growth of at least one implanted crystallization nucleus.

47 Claims, 5 Drawing Sheets

10 — INTRODUCING A CRYSTAL GROWTH PROMOTING SEED INTO A SILICON MATERIAL

11 — CONVERTING THE SILICON MATERIAL INTO HSG SILICON

METHOD TO FORM HEMISPHERICAL GRAIN (HSG) SILICON BY IMPLANT SEEDING FOLLOWED BY VACUUM ANNEAL

FIELD OF THE INVENTION

This invention relates to hemispherical grain silicon and more particularly to a process for forming hemispherical grain silicon for capacitor structures used in semiconductor devices.

BACKGROUND OF THE INVENTION

In dynamic semiconductor memory storage devices it is essential that storage node capacitor cell plates be large enough to retain an adequate charge (or capacitance) in spite of parasitic capacitance and noise that may be present during circuit operation. As is the case for most semiconductor integrated circuitry, circuit density is continuing to increase at a fairly constant rate. The issue of maintaining storage node capacitance is particularly important as the density of DRAM arrays continues to increase for future generations of memory devices.

The ability to densely pack storage cells while maintaining required capacitance levels is a crucial requirement of semiconductor manufacturing technologies if future generations of expanded memory array devices are to be successfully manufactured.

Storage cells formed with hemispherical grain polysilicon gains unique advantages as the hemispherical grain polysilicon enhances the surface area of a storage cell electrode without any additional complex processing. However, conventional methods of forming HSG polysilicon by deposition, develop roughness of the polysilicon which starts at the interface of the polysilicon and forms towards its surface. It is desirable to have the roughness of the polysilicon develop by starting at the polysilicon surface and continue to form towards the polysilicon's interface. The present invention develops such a technique.

U.S. Pat. No. 5,162,248, and U.S. Pat. No. 5,340,765, having the same assignee as does the present invention, are hereby incorporated by reference.

SUMMARY OF THE INVENTION

The present invention develops a process for forming hemispherical grain (HSG) silicon for fabrication of a semiconductor device, by the steps of:

introducing a crystallization nucleus (or nuclei) into a silicon material; and converting the silicon material into the HSG silicon by promoting growth of the crystallization nucleus (or nuclei).

DETAILED DESCRIPTION OF THE PRESENT INVENTION

An embodiment of present invention is directed to maximizing storage cell surface area by providing uniform, storage cell structures across a given supporting substrate, in a high density/high volume DRAM fabrication process. The following process steps, as described below, serve as an example as well as a preferred method of implementing the present invention. However, the example is not intended to limit a broad scope of the invention which is depicted in FIG. 1.

Figure 1:
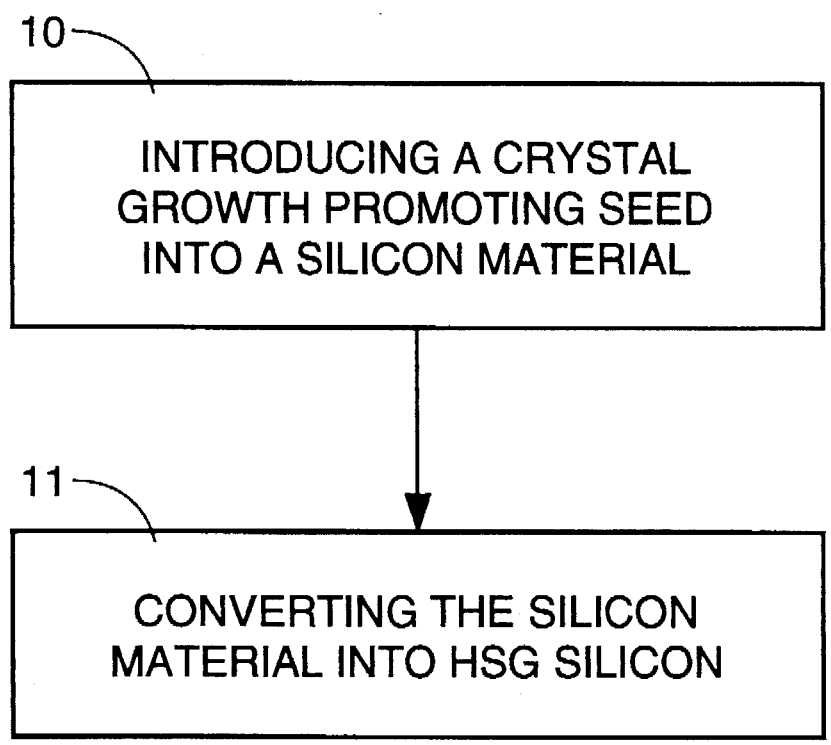
FIG. 1 is a flow chart depicting process steps of the present invention.

A general process step flow chart of the present invention is depicted in FIG. 1. As represented by step 10, a crystallization nucleus (also crystallization seed) is introduced into an existing silicon material. Next, in step 11, the silicon material is converted into hemispherical grain (HSG) silicon by subjecting the silicon material to a high vacuum anneal. These general steps are discussed in further detail in the following discussion concerning FIGS. 2–4.

Figure 2:
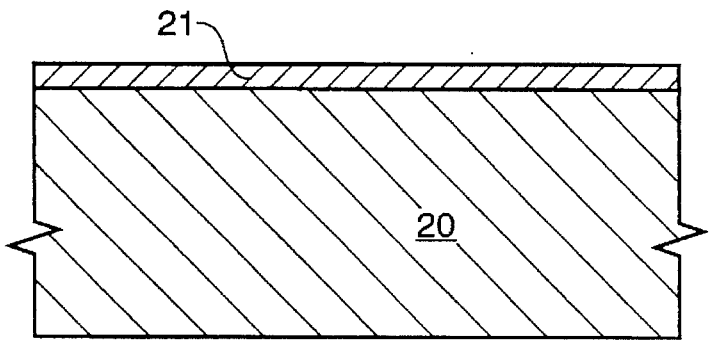
FIGS. 2–4 are cross-sectional views of an in-process wafer portion demonstrating general results of the process steps outlined in FIG. 1.

As shown in FIG. 2, a starting substrate 20 is overlaid by silicon material 21 (preferably by chemical vapor deposition). It is preferred that silicon material 21 be amorphous silicon, and it is further preferred that silicon material 21 be conductively doped amorphous silicon. Other silicon layers, such as crystalline silicon, polycrystalline silicon, or conductively doped polycrystalline silicon, may be substituted for amorphous silicon, though the structure of amorphous silicon (devoid of long-range periodic structure or there is no re-occurring crystal periodicity), is particularly effective when used in the present invention.

Figure 3:
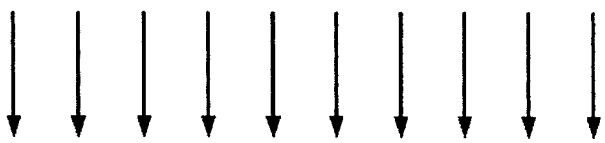
Figure 3:
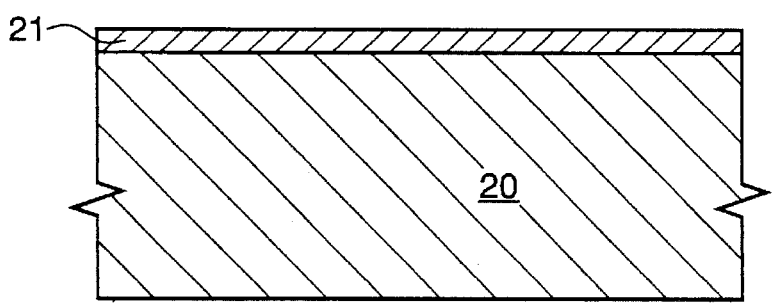

As shown in FIG. 3, a crystallization seed or nucleus is introduced into material 21. It is preferred that the crystallization nucleus (or nuclei) be implanted as the depth of the implant is controllable. It is also preferred that the depth of the implant of the crystallization nucleus reside at the upper surface boundary of material 21, as discussed in the process step depicted in FIG. 4. Even though implanting is the preferred method, it is conceivable that the crystallization nucleus could be introduced in situ during the formation of layer 21. The crystallization nucleus is an element selected from the group consisting of elements from groups IIIA, IVA or VA listed in the periodic table and any combination thereof. It is preferred that any one of the elements silicon (Si), boron (B), arsenic (As) or phosphorous (P) be used as the crystallization nucleus or any combination thereof. Group IIIA elements include boron (B), aluminum (Al), gallium (Ca), indium (In), and thallium (Tl). Group WA elements include carbon (C), silicon (Si), germanium (Ge), tin (Sn), and lead (Pb). Group VA elements include nitrogen (N), phosphorus (P), arsenic (As), antimony (Sb), and bismuth (Bi).

Figure 4:
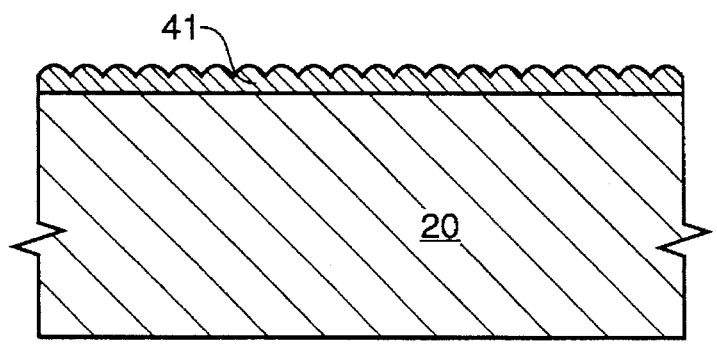

Referring now to FIG. 4, silicon material 41, impregnated with at least one crystallization nucleus element, is converted to HSG silicon by subjecting the crystallization nucleus impregnated silicon material to an ultrahigh vacuum anneal. This high vacuum anneal promotes crystal growth of the crystallization nucleus and thereby transforms the impregnated silicon into HSG silicon. The anneal temperature must be at least 350° C. and may range to 1050° C., and a preferred anneal temperature range is from 550° C.–750° C. This ultrahigh vacuum anneal is performed at a pressure less than 100 mTorr. A preferred method of converting the crystallization nucleus impregnated silicon material to HSG silicon by subjecting the material to rapid thermal processing (at an anneal temperature of at least 350° C. ranging to 1050° C., and a preferred anneal temperature range from 550° C.–750° C.). The stated temperature range is intended to include all temperatures and temperature ranges assumed therein.

FIGS. 5–8 depict various capacitor structures that can be obtained by using the process steps discussed above during capacitor fabrication for a memory device (i.e., dynamic random access memories, floating gate devices and the like).

Figure 5:
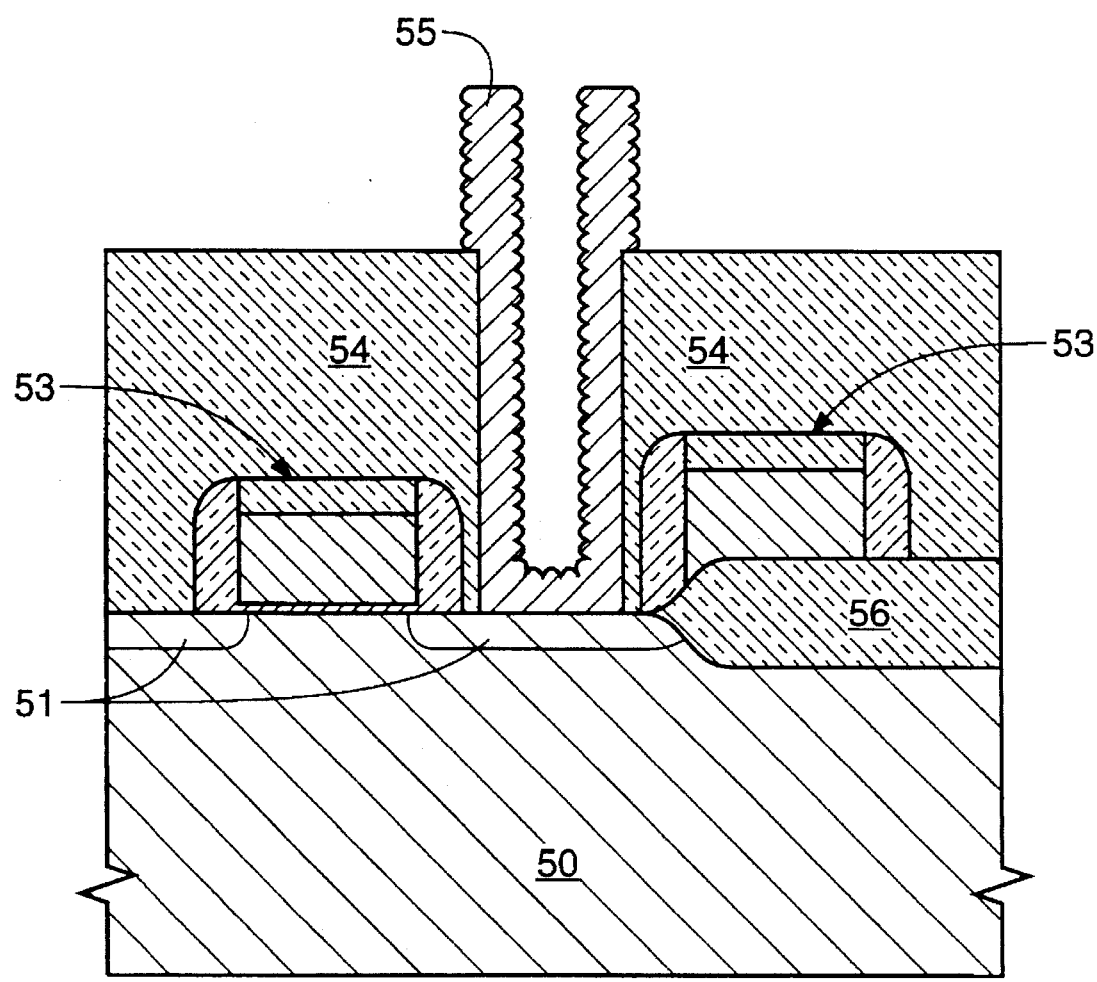
FIGS. 5–8 are cross-sectional views of in-process wafer portions demonstrating the results of the process outlined in FIG. 1 for specific applications.
Figure 6:
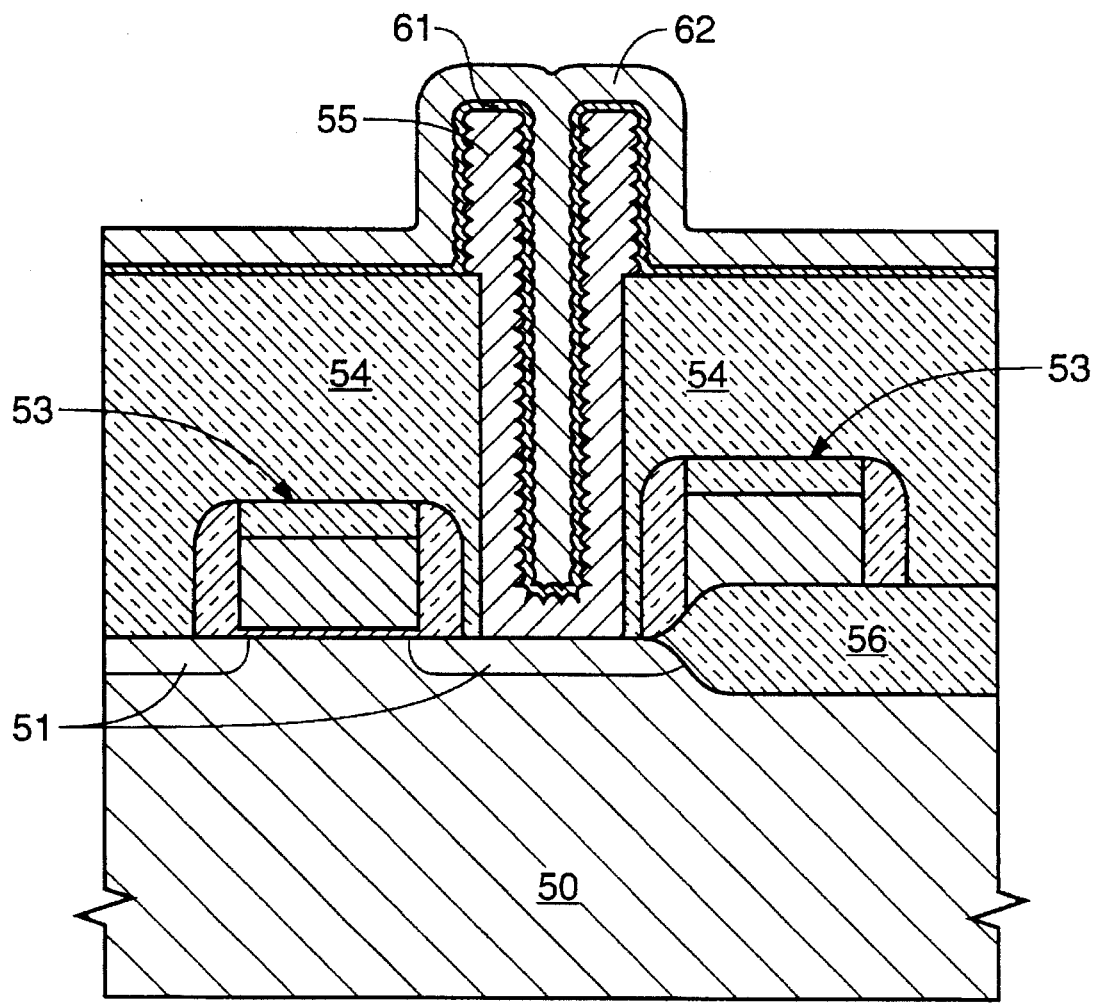

Referring now to FIG. 5, the storage capacitor plate 55 of each memory cell will make contact to the underlying diffusion region 51. Each underlying diffusion region 51 will have two storage node connections isolated from a single digit line contact by access transistors formed by poly word lines 53 overlying the active area of substrate 50. Normally each diffusion region 51 within the array is isolated from one another by a thick field oxide 56. Diffusion regions 51 and the poly wordlines 53 (control gates) form active field effect transistors (FETs serving as access transistors to each individual capacitor) that can be doped as NMOS or PMOS type FETs depending on the desired use. An etch, performed on planarized insulation layer 54, provides access to diffusion region 51 for placement of capacitor plate 55. Once capacitor plate 55 is formed, the silicon material making up the plate is processed in the manner outlined for FIGS. 2–4 to form the HSG silicon on the exposed surfaces of plate 55. FIG. 6 shows a completed capacitor with the inclusion of cell dielectric 61 and the second capacitor plate 62. From this point on the wafer is completed using conventional fabrication process steps.

Figure 7:
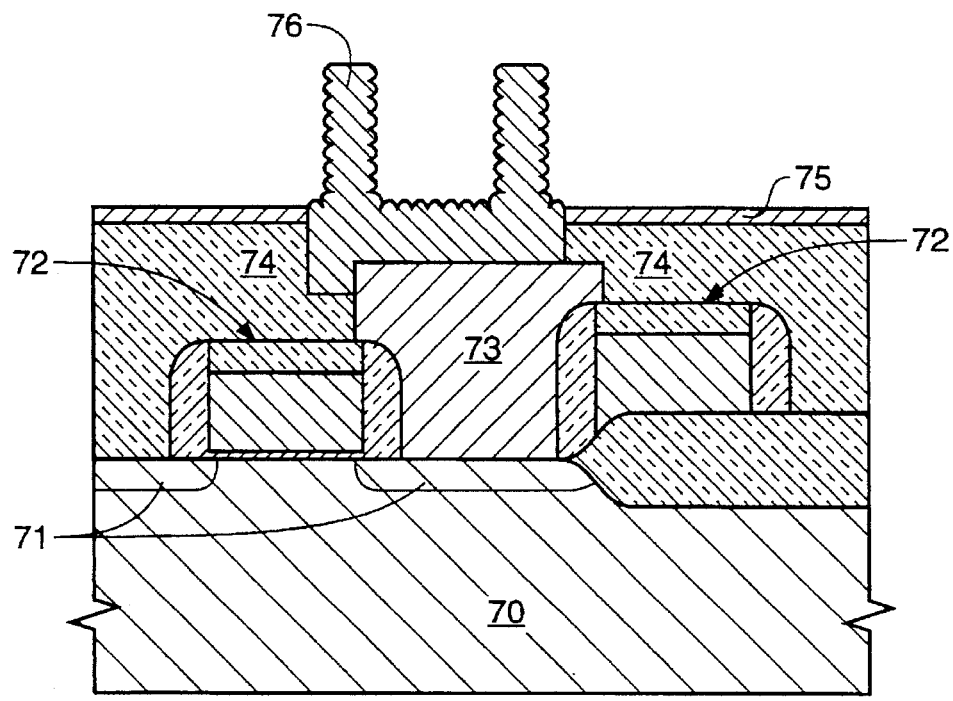
Figure 8:
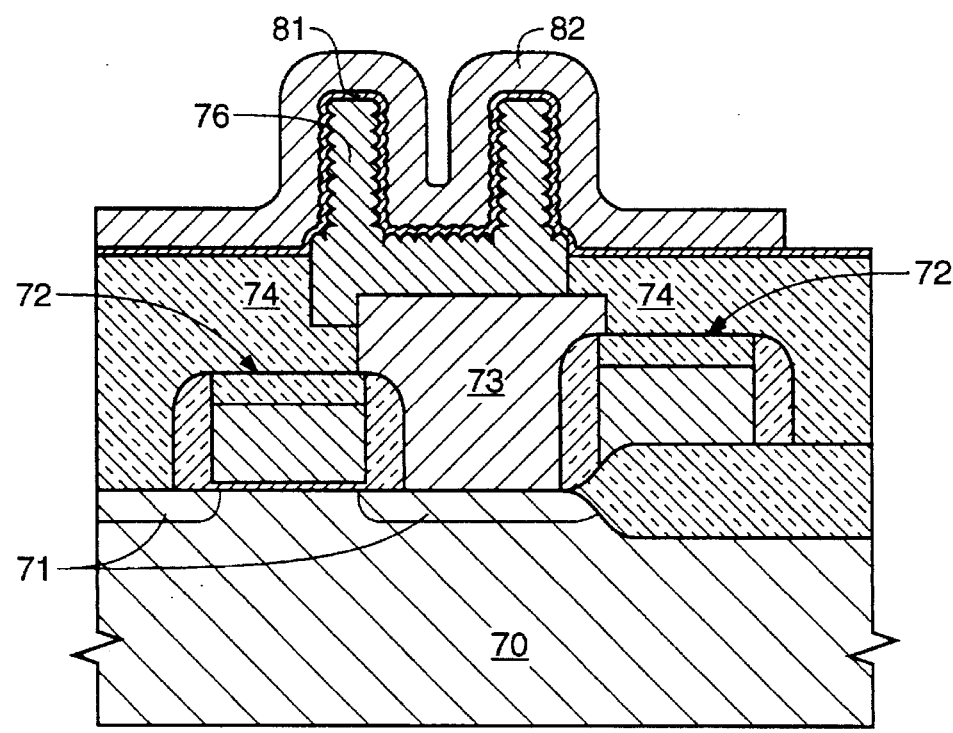

FIGS. 7 and 8, show a second formation of a capacitor with HSG silicon which follows the discussion of FIGS. 5 and 6. Referring now to FIG. 7, the storage capacitor plate 76 of each memory cell will make contact to the underlying diffusion region 71. Each underlying diffusion region 71 will have two storage node connections isolated from a single digit line contact by access transistors formed by poly wordlines 72 overlying the active area of substrate 70. Diffusion regions 71 and the poly wordlines 72 (control gates) form active field effect transistors (FETs), serving as access transistors to each individual capacitor, that can be doped as NMOS or PMOS type FETs depending on the desired use. An etch, into planarized insulation layer 74, provides access to diffusion region 71. FIG. 8 shows a completed capacitor with the inclusion of cell dielectric 81 and the second capacitor plate 82. Conductive plug 73 has been formed prior to capacitor plate 76 formation and is used to connect plate 76 to underlying diffusion region 71. From this point on the wafer is completed using conventional fabrication process steps.

It is to be understood that although the present invention has been described with reference to a preferred embodiment, various modifications, known to those skilled in the art, may be made to the structures and process steps presented herein without departing from the invention as recited in the several claims appended hereto.

We claim:

1. A process for forming hemispherical grain (HSG) silicon for fabrication of a semiconductor device, said process comprising the steps of:

introducing crystallization nuclei into a silicon material; and converting said silicon material into said HSG silicon by promoting growth of said crystallization nuclei.

2. The process as recited in claim 1, wherein said silicon material comprises amorphous silicon.

3. The process as recited in claim 1, wherein said silicon material comprises conductively doped amorphous silicon.

4. A process as recited in claim 3, wherein said step of converting further comprises subjecting said crystallization nuclei in said silicon material to rapid thermal processing.

5. The process as recited in claim 4, wherein said rapid thermal processing performed at an anneal temperature of at least 350° C. ranging to 1050° C.

6. The process as recited in claim 1, wherein said silicon material comprises polycrystalline silicon.

7. The process as recited in claim 1, wherein said silicon material comprises conductively doped polycrystalline silicon.

8. The process as recited in claim 1, wherein said crystallization nuclei are elements selected from the group consisting of boron (B), aluminum (Al), gallium (Ga), indium (In), thallium (Tl), carbon (C), silicon (Si), germanium (Ge), tin (Sn), lead (Pb), nitrogen (N), phosphorus (P), arsenic (As), antimony (Sb), and bismuth (Bi).

9. The process as recited in claim 1, wherein the step of introducing crystallization nuclei comprises implanting said crystallization nuclei.

10. The process as recited in claim 9, wherein said crystallization nuclei are implanted into an upper boundary surface of said silicon material.

11. The process as recited in claim 1, wherein said step of converting further comprises subjecting said crystallization nuclei in said silicon material to a vacuum anneal.

12. The process as recited in claim 11, wherein said vacuum anneal is performed at a pressure less than 100 mTorr and at an anneal temperature of at least 350° C. ranging to 1050° C.

13. A process as recited in claim 1, wherein said converting step further comprises subjecting said crystallization nuclei in said silicon material to rapid thermal processing.

14. The process as recited in claim 13, wherein said rapid thermal processing performed at an anneal temperature of at least 350° C. ranging to 1050° C.

15. A process for forming a capacitor plate having hemispherical grain (HSG) silicon, said process comprising the steps of:

introducing crystallization nuclei into a silicon material, said silicon material serving as said capacitor plate; and converting said silicon material into said HSG silicon by promoting growth of said crystallization nuclei.

16. The process as recited in claim 15, wherein said silicon material comprises amorphous silicon.

17. The process as recited in claim 15, wherein said silicon material comprises conductively doped amorphous silicon.

18. The process as recited in claim 15, wherein said silicon material comprises polycrystalline silicon.

19. The process as recited in claim 15, wherein said silicon material comprises conductively doped polycrystalline silicon.

20. The process as recited in claim 15, wherein said crystallization nuclei are elements selected from the group consisting of boron (B), aluminum (Al), gallium (Ga), indium (In), thallium (Tl), carbon (C), silicon (Si), germanium (Ge), tin (Sn), lead (Pb), nitrogen (N), phosphorus (P), arsenic (As), antimony (Sb), and bismuth (Bi).

21. The process as recited in claim 15, wherein the step of introducing crystallization nuclei comprises implanting said crystallization nuclei.

22. The process as recited in claim 21, wherein said crystallization nuclei are implanted into an upper boundary surface of said silicon material.

23. The process as recited in claim 15, wherein said step of converting further comprises subjecting said crystallization nuclei in said silicon material to a vacuum anneal.

24. The process as recited in claim 23, wherein said vacuum anneal is performed at a pressure less than 100 mTorr and at an anneal temperature of at least 350° C. ranging to 1050° C.

25. A process as recited in claim 15, wherein said capacitor plate is a storage capacitor plate.

26. A process as recited in claim 25, wherein said storage capacitor plate is fabricated into an array of storage cells in dynamic random access device.

27. A process for forming hemispherical grain (HSG) silicon for fabrication of a semiconductor device, said process comprising the steps of:

implanting crystallization nuclei into an upper boundary surface of a silicon material; and converting said silicon material into said HSG silicon by promoting growth of said crystallization nuclei during an anneal step.

28. The process as recited in claim 27, wherein said silicon material comprises amorphous silicon.

29. The process as recited in claim 27, wherein said silicon material comprises conductively doped amorphous silicon.

30. The process as recited in claim 27, wherein said silicon material comprises polycrystalline silicon.

31. The process as recited in claim 27, wherein said silicon material comprises conductively doped polycrystalline silicon.

32. The process as recited in claim 27, wherein said crystallization nuclei are elements selected from the group consisting of boron (B), aluminum (Al), gallium (Ca), indium (In), thallium (Tl), carbon (C), silicon (Si), germanium (Ge), tin (Sn), lead (Pb), nitrogen (N), phosphorus (P), arsenic (As), antimony (Sb), and bismuth (Bi).

33. The process as recited in claim 27, wherein said anneal step further comprises subjecting said crystallization nuclei in said silicon material to a vacuum anneal.

34. The process as recited in claim 33, wherein said vacuum anneal is performed at a pressure less than 100 mTorr and at an anneal temperature of at least 350° C. ranging to 1050° C.

35. A process as recited in claim 27, wherein said step of converting further comprises subjecting said crystallization nuclei in said silicon material to rapid thermal processing.

36. The process as recited in claim 35, wherein said rapid thermal processing performed at an anneal temperature of at least 350° C. ranging to 1050° C.

37. A process as recited in claim 27, wherein said semiconductor device is a memory device.

38. A process as recited in claim 37, wherein said memory device is a dynamic random access memory device.

39. A semiconductor device having hemispherical gain (HSG) silicon, said HSG silicon comprising:

a silicon material converted into said HSG silicon from the growth of at least one implanted crystallization nucleus.

40. The HSG silicon as recited in claim 39, wherein said silicon material comprises amorphous silicon.

41. The HSG silicon as recited in claim 39, wherein said silicon material comprises conductively doped amorphous silicon.

42. The HSG silicon as recited in claim 39, wherein said silicon material comprises polycrystalline silicon.

43. The HSG silicon as recited in claim 39, wherein said silicon material comprises conductively doped polycrystalline silicon.

44. The HSG silicon as recited in claim 39, wherein said HSG silicon is used to form a capacitor plate.

45. The HSG silicon as recited in claim 44, wherein said capacitor plate is used in a memory device.

46. The HSG silicon as recited in claim 45, wherein said memory device is a dynamic random access memory device.

47. The HSG silicon as recited in claim 45, wherein said memory device is a floating gate memory device.

* * * * *

UNITED STATES PATENT AND TRADEMARK OFFICE
CERTIFICATE OF CORRECTION

PATENT NO. : 5,658,381
DATED : Aug 19, 1997
INVENTOR(S) : Thakur et al.

It is certified that error appears in the above-identified patent and that said Letters Patent is hereby corrected as shown below:

Column 4, line 8, please delete "(Ca)" and replace with -- (Ga) --.
Column 5, line 24, please delete "(Ca)" and replace with -- (Ga) --.

Signed and Sealed this

Fourth Day of November, 1997

*Attest:*

BRUCE LEHMAN

*Attesting Officer*  *Commissioner of Patents and Trademarks*